United States Patent [19]

Shreve et al.

[11] Patent Number: 5,781,047
[45] Date of Patent: Jul. 14, 1998

[54] IGNITION COIL DRIVER MODULE

[75] Inventors: John Robert Shreve; Lester Wilkinson, both of Kokomo, Ind.

[73] Assignee: Delco Electronics Corporation, Kokomo, Ind.

[21] Appl. No.: 863,173

[22] Filed: May 27, 1997

Related U.S. Application Data

[63] Continuation of Ser. No. 522,982, Jul. 31, 1995, abandoned.
[51] Int. Cl.⁶ ........................................................ H03B 1/00
[52] U.S. Cl. ........................................... 327/110; 327/565
[58] Field of Search ........................... 327/110, 478, 327/565; 323/266, 311, 265

[56] References Cited

U.S. PATENT DOCUMENTS 4,475,280 10/1984 Ragonese et al. ................ 29/577 C
4,929,884 5/1990 Bird et al. ............................. 323/313
4,961,006 10/1990 Pace et al. ............................ 327/110
5,424,665 6/1995 Sueri et al. ........................... 327/110

*Primary Examiner*—Timothy P. Callahan
*Assistant Examiner*—Jung Ho Kim
*Attorney, Agent, or Firm*—Jimmy L. Funke

[57] ABSTRACT

The ignition coil driver module of the present invention includes a control integrated circuit and a high current load driver integrated circuit housed within a common package such as a TO-247 or TO-264 package. The control integrated circuit is formed of a semiconductor material manufactured in accordance with a standard low-voltage integrated circuit processing technology and is responsive to a control signal input to provide a low voltage drive signal. The high current load driver integrated circuit is formed of a semiconductor material manufactured in accordance with a high-voltage integrated circuit processing technology and is responsive to the low voltage drive signal to energize the high current load. A current limit function is further provided for limiting the load current to a predetermined level.

24 Claims, 3 Drawing Sheets

5,781,047

1

IGNITION COIL DRIVER MODULE

This is a continuation of application Ser. No. 08/522,982 filed on Jul. 31, 1995; now abandoned.

FIELD OF THE INVENTION

The present invention relates generally to circuitry for driving an ignition coil of an electronic ignition system, and more specifically to such circuitry composed entirely of semiconductor material arranged as integrated circuitry.

BACKGROUND OF THE INVENTION

In the past few decades, the automotive industry has striven to expand both the number and types of vehicular functions and systems subject to computer control. Due in part to the proliferation of such computer control, however, available physical space within a vehicle has correspondingly diminished, thereby resulting in a demand for more compact control systems. At the same time, owing both to the competitive climate within the industry and to the crucial nature of some of the vehicular functions under computer control, the overall reliability of such control systems has risen to the level of paramount importance.

As an example of one such system subject to computer control, a modern automotive ignition system typically includes an ignition coil and a coil current switching device responsive to an ignition, or "drive", signal to energize the ignition coil. Some type of control circuitry, responsive to microprocessor control, provides a drive signal to the coil current switching device to thereby energize the primary side of the ignition coil.

Typical prior art automotive ignition systems have incorporated the control circuitry and coil current switching device into a single ignition module using a so-called hybrid electronics technology. Essentially, hybrid electronics is an amalgamation of integrated circuit technology and discrete electronic component technology arranged and surface mounted on a ceramic substrate such as, for example, alumina.

Hybrid ignition modules have been well received in the automotive industry, but they suffer from several inherent drawbacks. First, due simply to the number and size of discrete and integrated components required for operation, the overall size of an ignition module can be quite large as compared to typical packaged integrated circuits. This problem is compounded by limitations inherent in hybrid processing technology, such as large conductor line widths and conductor routing limitations. The size and number of componentry further adds to the overall weight of the module which, as the number of such vehicular control systems increases, can become a significant factor in system design. Second, such hybrid modules are typically expensive to produce, particularly when compared to processing costs associated with comparably complex integrated circuits. Finally, because of the number of module components and interconnections therebetween, module reliability can be significantly less than that of comparably complex integrated circuits.

Designers of automotive ignition modules have attempted to address the foregoing drawbacks inherent in hybrid technology by designing so-called "single chip" ignition coil control circuits. Such circuits incorporate the control circuitry and coil driver device into a single high voltage integrated circuit, typically formed of silicon. Although typical single chip approaches address many of the drawbacks associated with hybrid ignition modules, they have their own inherent drawbacks to consider.

First, any single chip circuit incorporating a coil driver device therein must necessarily utilize a very high voltage semiconductor process for the control circuitry as well as the coil driver device. As such, this constitutes wasteful utilization of advanced semiconductor processing techniques since ignition control circuitry can generally be more cost effectively implemented with conventional integrated circuit processes.

Second, most single chip approaches provide the coil driver device in the form of a power transistor requiring drive currents on the order of 100 milliamperes. Since most automotive computer-controlled systems operate from low current regulated power supplies, the drive current demands of such single chip devices may require either more robust or supplemental power supplies for successful operation. In either case, most of the prior art single chip ignition coil control circuits further require some type of discrete componentry to limit power supply current.

Third, prior art single chip ignition coil control circuits are somewhat limited in their range of application. Since different ignition systems incorporate different ignition coils, a wide variety of coil current requirements result therefrom. Single chip ignition coil control circuits must thus undergo expensive re-design and re-layout for each substantially higher or lower current capability version.

Finally, most prior art single chip ignition control circuits incorporate a bipolar junction power transistor as the coil driver device. Such a coil driver device is susceptible to becoming biased under a reverse battery condition so as to provide a high current flow back through the power transistor and the ignition coil, thereby resulting in potential damage to each. Such bipolar junction power transistors are further susceptible to a condition known as thermal "runaway", which occurs during high temperature and/or high power operating conditions. Essentially, thermal runaway may occur in a bipolar junction transistor because the collector current in such a device increases with increased junction temperature. This phenomena becomes a concern when driving inductive loads such that power dissipation increases with increased collector current, thereby resulting in further increased junction temperatures. This effect can become cumulative if proper corrective actions are not taken, such as through proper heat sinking and robust transistor design, eventually resulting in destruction of the transistor.

What is therefore needed is an ignition coil driver arrangement that overcomes the foregoing undesirable characteristics associated with both the prior art approaches. Such an ignition coil driver arrangement should be easily and inexpensively produced to form an advantageously compact device.

SUMMARY OF THE INVENTION

The forgoing shortcomings of the prior art are addressed by the present invention. According to one aspect of the present invention, a high current load drive module comprises a control circuit responsive to a low voltage control signal to provide a low voltage drive signal, wherein the control circuit is formed of a low voltage semiconductor material arranged as a first integrated circuit, a high current load drive circuit responsive to the low voltage drive signal to energize the high current load, wherein the high current load drive circuit is formed of a high voltage semiconductor material arranged as a second integrated circuit;, and a housing having the first and second integrated circuits mounted therein.

In accordance with another aspect of the present invention, a high current load drive module comprises a low voltage integrated control circuit including power supply and drive circuitry, wherein the power supply circuitry is responsive to a low voltage control signal to supply electrical power to the drive circuitry, and the drive circuitry is responsive to the electrical power and to the low voltage control signal to provide a low voltage drive signal. A high voltage integrated drive circuit is further included and is responsive to the low voltage drive signal to energize the high current load. Finally, a housing is provided having the low voltage control and high voltage drive integrated circuits mounted therein.

One object of the present invention is to provide a dual chip ignition coil driver module wherein a control integrated circuit provides a low voltage drive signal and is manufactured according to a standard low-voltage integrated circuit process technology, and a high current drive integrated circuit manufactured according to a high-voltage integrated circuit process technology is responsive to the low voltage drive signal to energize the ignition coil.

Another object of the present invention is to provide a dual chip ignition coil driver module which can be activated and powered directly from an externally generated control signal.

These and other objects of the present invention will become more apparent from the following description of the preferred embodiment.

DESCRIPTION OF THE PREFERRED EMBODIMENT

Figure 1:
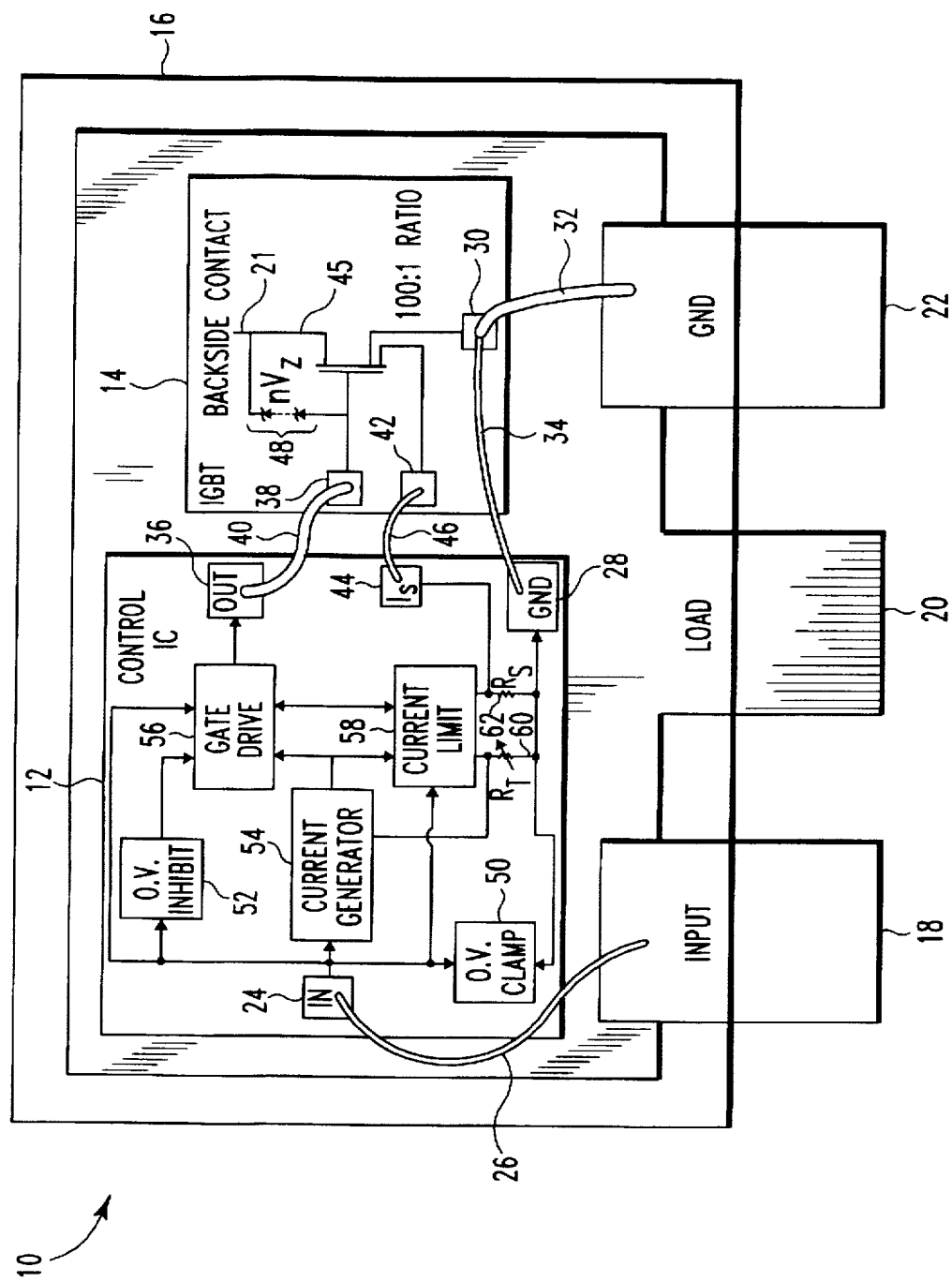
FIG. 1 is a schematic diagram of a preferred embodiment of an ignition coil driver module in accordance with the present invention.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to FIG. 1, a preferred embodiment of an ignition coil drive module 10, in accordance with the present invention, is shown. Ignition coil drive module 10 includes a control integrated circuit 12 and a high current load drive integrated circuit 14 mounted within a housing 16. Housing 16 may include a number of electrically conducting terminals extending therein to provide electrical connection to either of the circuits 12 and 14. In a preferred embodiment, as shown in FIG. 1, housing 16 includes three such electrical terminals.

A first terminal 18 (INPUT) extends into housing 16 and is electrically connected to an input 24 (IN) of the control integrated circuit 12. Preferably, terminal 18 is connected to input 24 via a bond wire 26, as is commonly known within the integrated circuit industry, although the present invention contemplates other known techniques of making such an electrical connection such as via tape-automated-bonding (TAB) or solder bump attachment, for example.

A second terminal 20 (LOAD) extends into housing 16 and is electrically connected to a load current input 21 of the high current load drive circuit 14. Preferably, terminal 20 forms an integrated circuit mount for mounting integrated circuits 12 and 14 thereto. Further, the substrate of high current load drive integrated circuit 14 is preferably the load current input 21 thereto so that electrical connection between terminal 20 and load current input 21 may be made by mounting circuit 14 to terminal mount 20 via an electrically conducting attachment medium. Generally, the electrically conducting integrated circuit attachment medium serves two functions. First, it should be formed of a material that will maintain both a structural and electrical bond between circuit 14 and terminal 20 under high temperatures generated by the conduction of load current through the circuit 14. Second, it should be formed of a material having high thermal conductivity so that heat generated by the conduction of load current through circuit 14 may be effectively passed to terminal 20, which also acts as a heat sink for the module 10. Preferably, the electrically conducting attachment medium is an integrated circuit mounting solder, as is commonly known in the integrated circuit industry, although the present invention contemplates using other known electrically conducting attachment media. An example of one such medium is electrically conductive epoxy, although it is to be understood that such an epoxy generally has a higher thermal resistance than solder and may therefore only be reliably used in low load current/low power applications.

A third terminal 22 (GND) extends into housing 16 and is electrically connected to ground references 28 and 30 of control integrated circuit 12 and high current drive integrated circuit 14 respectively. Preferably, terminal 22 is connected to ground reference 30 via a bond wire 32 or equivalent connection as previously discussed, and ground reference 30 is connected to ground reference 28 via a bond wire 34 (or equivalent structure). However, the present invention contemplates that bond wire 32 may alternatively be connected to ground reference 28, or that both bond wires 32 and 34 may be connected to terminal 22 at one end, with the opposite end of each bond wire connecting to the respective ground reference 28 or 30. As is common in the integrated circuit industry, the substrate of control integrated circuit 12 is preferably connected to ground reference 28. Thus, attachment of control integrated circuit 12 to terminal 20 must be made via an electrically insulating medium to avoid shorting the load current input 21 of the high current load drive integrated circuit 14 to ground potential. Preferably, the electrically insulating attachment medium is an electrically non-conductive epoxy, although the present invention contemplates using other known electrically insulating adhesives as the attachment medium. Alternatively, a layer of electrically insulating material may be deposited or otherwise attached to a portion of terminal 20 under integrated circuit 12. Integrated circuit 12 may then be attached to the electrically insulating material via any type of epoxy or other known attachment media. The layer of electrically insulating material may be formed of $SiO_2$ (glass), silicon nitride, polyimide, or any other electrically insulating material commonly used in the semiconductor industry.

Housing 16 is preferably formed of an integrated circuit encapsulant commonly known in the integrated circuit industry. In its final form, the ignition coil driver module 10 is provided as a three-pin integrated circuit package, preferably having either a TO-247 or TO-264 package configuration. However, the present invention contemplates providing ignition coil driver module 10 in any of a variety of known package configurations, or in a custom package configuration, an important advantage of module 10 being a significant size and weight reduction over prior art hybrid-type ignition modules.

In addition to input IN 24, control integrated circuit 12 further includes an output 36 (OUT) for providing a "drive" signal to a corresponding input 38 of high current load drive integrated circuit 14. Further, high current load drive integrated circuit 14 includes an output 42 for feeding back a portion of the load current to an input 44 ($I_s$) of control integrated circuit 12. OUT 36 is connected to input 38, and output 42 is connected to $I_s$ 44, preferably by bond wires 40 and 46 respectively, although the present invention contemplates alternative arrangements for providing electrical connections therebetween as previously discussed.

An important advantage of the present invention is the partitioning of the ignition coil drive functions into a control integrated circuit 12 and a high current load drive integrated circuit 14. All functions typically considered to be "control" functions, examples of which will be provided hereinafter, are incorporated into the control integrated circuit 12, and the high current load drive integrated circuit 14 provides the necessary drive capability to energize the load. In a typical application of module 10, the load is a primary coil of an automotive ignition coil, which generally has high voltages and load currents associated therewith. Since voltages within the 400–600 volt range, and load currents within the 500 milliampere to 20 ampere range, are typically encountered in normal operation of the primary of an automotive ignition coil, integrated circuit 14, preferably formed of silicon, must be manufactured using a high voltage semiconductor process capable of operating at voltages in excess of 600 volts. The control integrated circuit 12, on the other hand, need only operate at low voltages to provide control functions internal to circuit 12 and to provide a sufficient drive signal to circuit 14. Typical voltage levels associated with control integrated circuit 12 operation may range from between approximately 3.0 volts to approximately 24 volts. Integrated circuit 12, also preferably formed of silicon, may therefore be manufactured using a standard (and comparatively inexpensive) low voltage process typically operating at voltages of less than 24 volts. One such common low voltage bipolar integrated circuit process is capable of withstanding, without damage thereto, voltages up to the 40–60 volt range. Thus, the integrated circuit partitioning approach of the present invention, as illustrated with the ignition coil driver module 10 of FIG. 1, offers the size and weight advantages (as well as other advantages discussed hereinafter) that prior art "single chip" ignition coil drive circuits enjoy over similar hybrid-type approaches, while further offering the advantage of providing much of the module 10 circuitry, namely control circuit 12, with a low cost and commonly used low voltage integrated circuit process technology.

High current load driver integrated circuit 14 includes a power transistor 45 as its central component. Transistor 45 has a drive input 38 which is responsive to a drive signal to provide a load current conduction path between load current input 21 and output 30 (typically ground referenced). In FIG. 1, transistor 45 also includes a second output 42 which provides a portion of the load current thereat, as will be more fully discussed hereinafter. Transistor 45, as previously indicated, must be capable of operating at load currents of between approximately 500 milliamperes and 20 amperes. Although the load may typically be the primary coil of an automotive ignition coil, the present invention contemplates utilizing the integrated circuit partitioning approach disclosed herein to provide load drive capability to a wide variety of such high current loads. As one example of such a high current load, fuel injectors for internal combustion engines are typically inductive loads requiring load currents in the range of approximately 500 milliamperes to approximately 10 amperes. Other such high load current uses for the integrated circuit partitioning approach of the present invention will become apparent to those skilled in the integrated circuit and electronic system design arts.

A phenomena known as "inductive flyback" is known to occur when driving inductive loads with a circuit configuration of the type shown in FIG. 1. Essentially, this phenomena occurs when a high current has been established at transistor input 21, and the drive signal to the input 38 of transistor 45 is thereafter removed. The subsequent inductive "flyback" effect creates a high voltage at input 21 which may exceed the breakdown voltage of the transistor 45 junctions located between input 21 and output 30. The combination of this high voltage and full load current creates a potentially destructive condition for transistor 45. To guard against such potential damage, it is known to provide a series, or stack, of n zener diodes 48 between inputs 21 and 38 of transistor 45. The number n is chosen so that the aggregate breakdown (avalanche) voltage of the zener diode stack 48 is less than the minimum avalanche breakdown voltage of the transistor 45 junctions located between input 21 and output 30. In operation, if the high voltage at input 21 created by the "flyback" effect exceeds the zener diode stack 48 aggregate breakdown voltage, current flows through stack 48, thereby turning transistor 45 back on. In this manner, the voltage at input 21 of transistor 45 is actively clamped at a maximum voltage approximately equal to the aggregate breakdown voltage of zener diode stack 48.

Preferably, power transistor 45 is a known metal-oxide-semiconductor field effect transistor (MOSFET) variant known in the semiconductor industry as an insulated gate bipolar transistor (IGBT). IGBT 45 may be turned on to full conduction with the application of a small current at its gate (input 38) to charge its gate capacitance to approximately 2–4 volts. Typically, this small input current is within the range of between approximately 200 micro amperes to approximately 3.0 milliamperes.

Apart from the low current drive requirements of IGBT 45, another advantage of using such a device lies in its inherent reverse voltage blocking capability. With a darlington-connected bipolar junction power transistor (BJT) pair commonly used as a power output device in prior art ignition coil driver systems, a normally reverse-biased parasitic body diode exists across the collector-emitter of the transistor pair. This parasitic diode is inherent in the construction of such a darlington-connected bipolar transistor pair. Thus, if the battery, typically connected between the ignition coil primary and ground, is connected with reverse polarity, the parasitic body diode becomes forward biased, thereby conducting potentially high current back through the ignition coil primary. IGBT 45, by contrast, has no such parasitic body diode so that the reverse breakdown voltage between output 30 and input 21 is much higher than typical battery voltages, thereby blocking potentially high current flow through the coil primary under a reverse battery condition.

A further advantage of using IGBT 45 is that this type of device is not susceptible to the same type of thermal runaway characteristics previously discussed with respect to BJTs. As a result, IGBT 45 offers more robust and reliable operation during high temperature/high current operating conditions than prior art ignition coil driver circuits using BJTs as the power output device.

Although an IGBT is a preferred embodiment of power output transistor 45, particularly in view of foregoing advantages associated therewith, the present invention further contemplates using other known power transistors as transistor 45 such as, for example, a power BJT or a power MOSFET. Although such power output devices may not provide optimal operating characteristics for ignition coil drive module 10, other considerations may require their use. Moreover, other applications of the integrated circuit partitioning concepts of the present invention may require, in some circumstances, use of such other power output devices. It is to be understood that the use of such -power output devices in any such system employing the integrated circuit partitioning concepts disclosed herein is intended to fall within the scope and spirit of the present invention.

Power transistor 45 further includes an output leg 42 extending therefrom. Typically, output leg 42 of IGBT 45 is set up to provide a sense current which is a 100:1 ratio of the load current flowing from input 21 to ground 30. If the load current flowing from input 21 to ground 30 is equal to 6 amperes, the current flowing through output leg 42 will therefore be approximately 60 milliamperes, thus resulting in a total load current through IGBT 45 of approximately 6.06 amperes. If power transistor 45 is a typical BJT, the 100:1 ratioing may be accomplished through appropriate ratioing of emitter areas, as is known in the art of integrated circuit design.

IF power transistor 45 is a MOSFET or IGBT, the 100:1 ratioing may be 30 accomplished by isolating an appropriately sized portion of the transistor source diffusion, and providing the isolated portion as source leg 42. A more detailed explanation of the 100:1 ratioing with an IGBT is given in related U.S. patent application having Ser. No. 08,508,402, entitled IGNITION COIL DRIVER MODULE INCLUDING COIL CURRENT LIMITING FEATURE, filed by John R. Shreve et al., and assigned to the assignee of the present invention. Those skilled in the art will recognize that any desired sense current to load current ratio may be provided through appropriate sizing of the BJT emitter areas or source diffusion isolation.

Turning now to control integrated circuit 12, the functional blocks shown therein will now be described in detail. It should first be pointed out that IN 24 is connected to every functional block shown within the borders of integrated circuit 12, and that no power supply input to circuit 12 exists. Since the control integrated circuit 12 may be manufactured from a low voltage semiconductor process as previously indicated, and since IGBT 45 has low input current requirements, the entire control circuit 12 does not require much current to operate. Typically the total current required by control integrated circuit 12 is between approximately 2–3 milliamperes. As such, a power supply connection to the circuit 12 is not required and all circuitry on the control integrated circuit 12 is simultaneously powered and activated through a control signal at input IN 24. In other words, a control signal at input IN 24 instructs module 10 to turn on and activate IGBT 45 for as long as the control signal is present.

Input IN 24 is connected to an over-voltage clamp circuit 50 which clamps the control signal at input IN 24 at a clamp voltage of between approximately 32–40 volts to prevent damage to the control circuit 12. Over-voltage clamp circuit 50 essentially utilizes a stack of zener diodes in series with a known "Vbe multiplier" to establish the clamp voltage as is known in the integrated circuit design art. In implementing circuit 12 with a known low voltage bipolar semiconductor process, a stack of four such diodes are used, each having an avalanche breakdown voltage of between approximately 7–8 volts, in series with a $V_{be}$ multiplier (established by a base/emitter voltage drop of approximately 600–800 millivolts by a resistor ratio as is known in the art), thus resulting in a clamp voltage of between approximately 32–40 volts.

Input IN 24 is further connected to an over-voltage inhibit circuit 52 which is further connected to a gate drive circuit 56. Over-voltage inhibit circuit 52 monitors the control signal at input IN 24 and inhibits operation of the gate drive circuitry 56 if the voltage at input IN 24 exceeds a normal battery voltage level. Typically, a battery voltage of above approximately 24 volts is considered to exceed a normal battery voltage level. Over-voltage inhibit circuit 52, like over-voltage clamp circuit 50, essentially utilizes a stack of zener diodes in series with a $V_{be}$ multiplier to establish the over-voltage inhibit level as is known in the integrated circuit design art. Preferably, a stack of three such diodes are used in series with a $V_{be}$ multiplier, as previously described, to thereby establish an over-voltage inhibit level of between approximately 26.5–32.0 volts.

Input IN 24 is further connected to a current generator circuit 54 which is, in turn, connected to gate drive circuit 56, a current limit circuit 58 and a trimmable resistor $R_T$. Current generator circuit 54 contains a series of known "delta $V_{be}$" current sources which are responsive to the control signal at input IN 24 to supply reference currents to the foregoing circuits.

Input IN 24 is further connected to gate drive circuit 56 which operates under the direction of over-voltage inhibit circuit 52 and current generator circuit 54. If the control signal at input IN 24 is less than the over-voltage inhibit level of between approximately 26.5–32.0 volts, a reference current generated by current generator circuit 54 turns on the gate drive control circuit 56, thereby providing a coil drive signal at output OUT 36. Essentially, gate drive circuit 56 is an output stage having current sourcing and current sinking capability as is known in the integrated circuit design art. Gate drive circuit 56 preferably includes some type of known voltage clamp circuitry for clamping the output voltage between approximately 7–8 volts. In order to drive the gate 38 of IGBT 45, as previously discussed, output OUT 36 is capable of sourcing at least 3 milliamperes. Gate drive circuit 56 further includes circuitry responsive to the over-voltage inhibit circuit 52 such that if the control signal at input IN 24 exceeds the over-voltage inhibit level of between approximately 26.532.0 volts, the current source portion of gate drive circuit 56 is disabled.

Input IN 24 is further connected to current limit circuit 58 which is further connected to current generator circuitry 54, the current source circuitry of gate drive circuit 56 and resistors $R_T$ 60 and $R_S$ 62. Resistor $R_T$ 60 is a trimmable resistor such that the resistance of $R_T$ 60 may be increased by opening fusible links to thereby incrementally add series resistance to $R_T$ 60, as is known in the integrated circuit art, and is further connected to a reference current supplied by current generator 54 to provide a fixed reference voltage across $R_T$ 60. Resistor $R_S$ 62 is a fixed resistor and is further connected to input $I_S$ 44.

In operation, current generator 54 is responsive to a control signal at input IN 24 to supply reference currents to the current limit circuitry 58 and resistor $R_T$ 60. The gate drive circuit 56 is further responsive to the control signal to provide a low-voltage (up to 7–8 volts) at output OUT 36, thereby driving the gate 38 of IGBT 45. As IGBT 45 begins to turn on, output leg 42 of IGBT 45 provides a sense current therethrough to resistor $R_S$ 62, which is preferably a 100:1 ratio of the load current. Essentially, the current limit circuit 58 is an error amplifier, and resistors $R_T$ 60 and $R_S$ 62 are connected to inputs thereof. As the sense current through $R_S$ 62 increases, the voltage drop across $R_S$ 62 increases. As the voltage drop across $R_S$ 62 approaches that of the reference voltage across $R_T$ 60, the error amplifier decreases the gate drive voltage at output OUT 36 of control circuit 12. Circuit equilibrium is reached when the voltage drop across $R_S$ 62 is approximately equal to the voltage drop across $R_T$ 60 (preferably between approximately 50–60 millivolts). Such an emitter coupled error amplifier is known in the integrated circuit design art and, in a preferred embodiment, $R_S$ 62 and $R_T$ 60 are chosen so that the gate drive output at OUT 36 begins to decrease when the load current rises to approximately 6 amperes. The current limit circuit 58 thereafter decreases the gate drive output at OUT 36, until circuit equilibrium is reached wherein the voltage drop across $R_S$ 62 is approximately 50–60 millivolts. A more detailed explanation of the operation of the foregoing current limit function is provided in related U.S. patent application having Ser. No. 08,508,402 entitled IGNITION COIL DRIVER MODULE INCLUDING COIL CURRENT LIMITING FEATURE, filed by John R. Shreve et al., and assigned to the assignee of the present invention.

Figure 2:
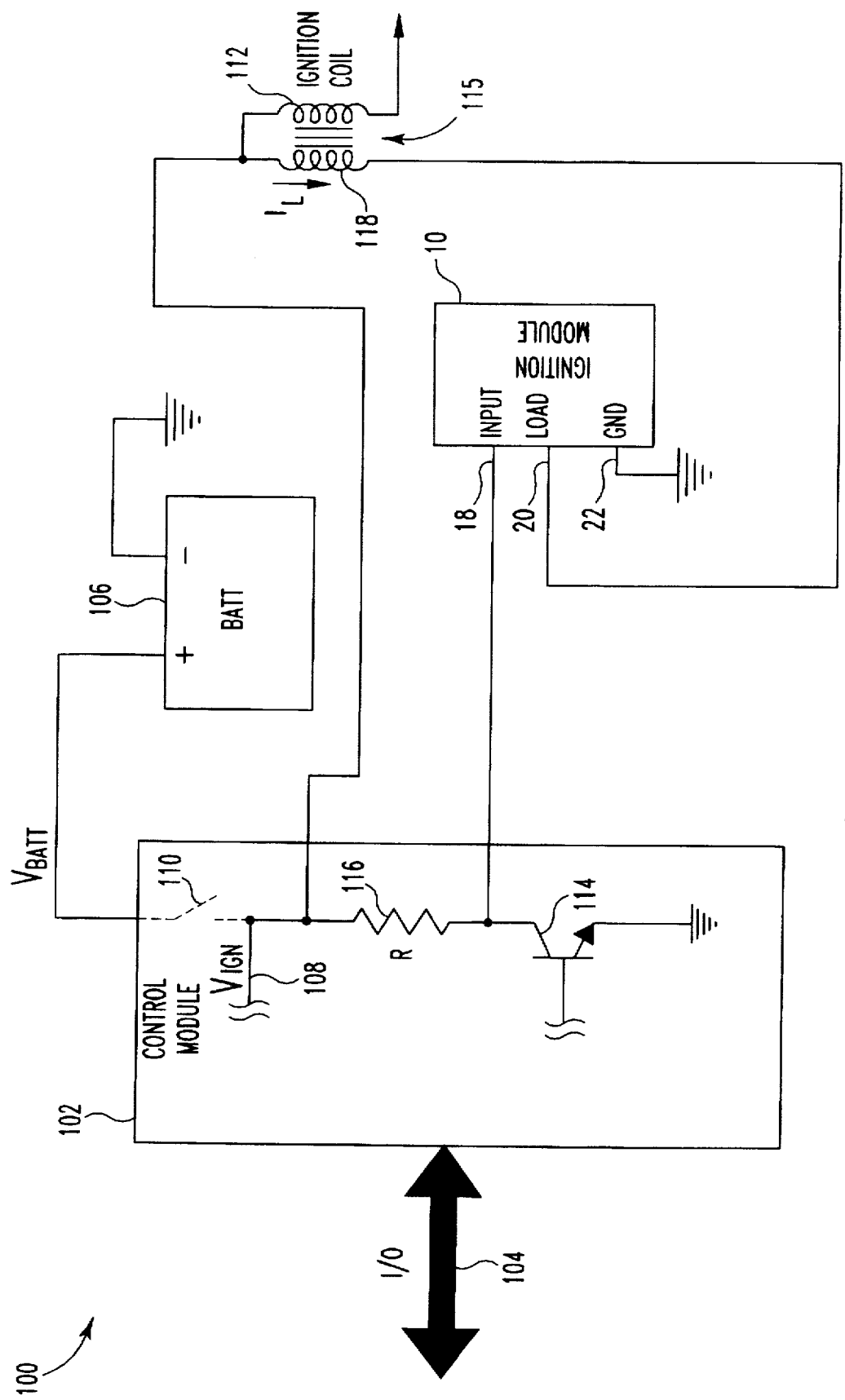
FIG. 2 is a schematic diagram showing a typical implementation of the ignition coil driver module of FIG. I in an ignition control system.

Referring now to FIG. 2, a typical ignition control system 100 is shown incorporating the ignition coil driver module 10 of FIG. 1. Central to ignition control system 100 is control module 102, sometimes referred to in the automotive industry as an electronic control module (ECM) or powertrain control module (PCM). By either name, control module 102 is a computer controlled module, typically under microprocessor control, and includes read-only-memory (ROM) and random-access-memory (RAM) for storing data and software algorithms executable by the microprocessor (not shown). Control module 102 includes a plurality of input and output (I/O) 104 connections for interfacing with various operational and diagnostic signals.

Control module 102 is powered by battery 106 which provides a battery voltage $V_{BATT}$ of between approximately 7.0 volts and 24 volts, with typical $V_{BATT}$ voltages being in the range of approximately 12–16 volts.

As shown in FIG. 2, battery voltage $V_{BATT}$ is connected to a switch 110 which is, in turn, connected to a signal line labeled VIGN 108.

Although shown as a physical switch within control module 102, switch 110 preferably represents a portion of a vehicle ignition switch operable via an ignition key. Ignition key switch (not shown) typically has an "off" position, an "on" position and a "crank" position. When the ignition key switch is switched from the "off" position to either the "crank" position or the "on" position (hereinafter referred to as an "ignition signal"), switch 110 connects the voltage $V_{BATT}$ to the VIGN 108 line. VIGN line 108 is connected to one end of the primary 118 and secondary 112 coils of the ignition coil 115, and to one end of a pull-up resistor R 116. The other end of resistor R 116 is connected to the collector of transistor 114 and to INPUT 18 of ignition coil driver module 10. The emitter of transistor 114 is referenced at ground potential and the base of transistor 114 is driven by circuitry within control module 102. LOAD 20 of ignition coil driver module 10 is connected to the remaining end of the primary coil 118 of the ignition coil 115.

Figure 3:
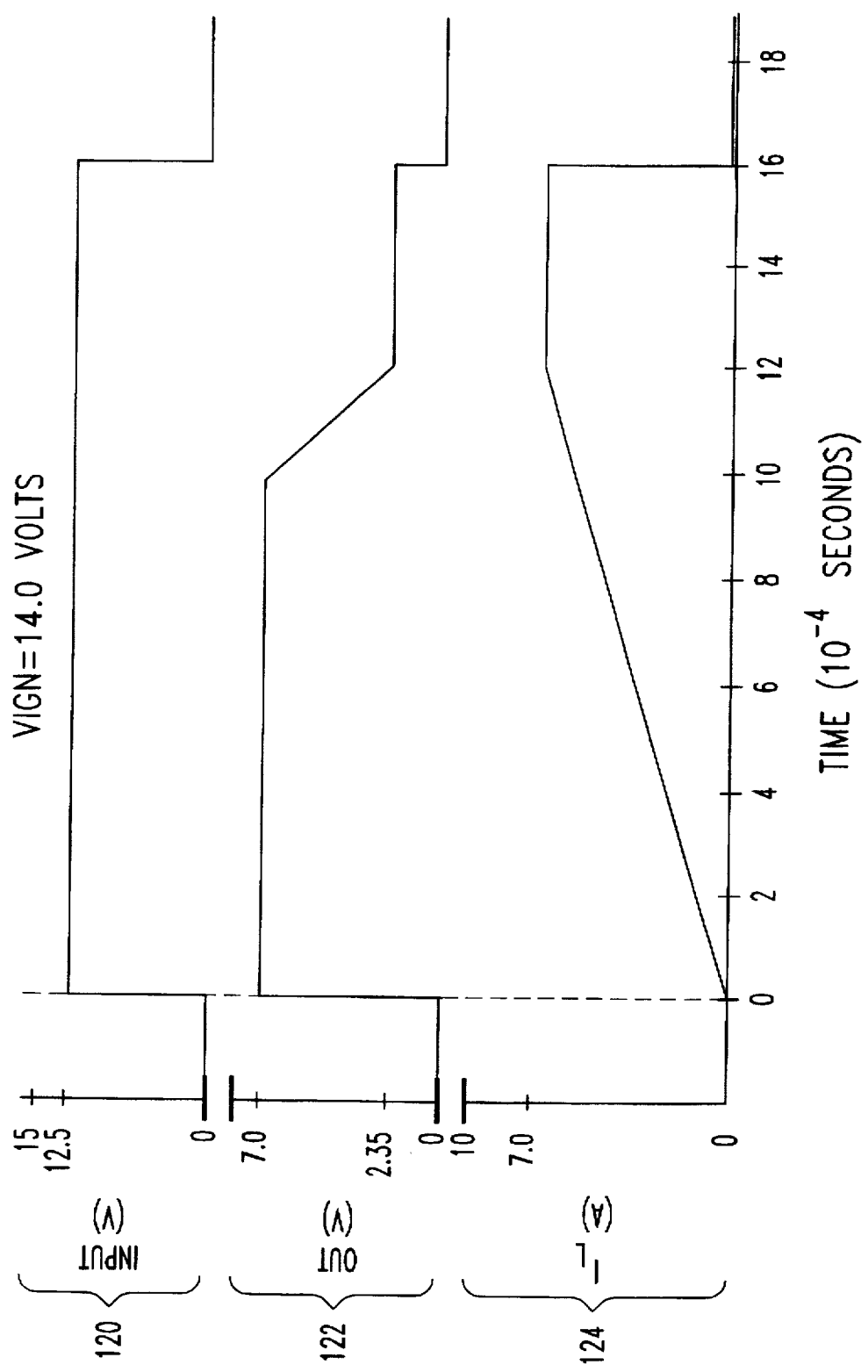
FIG. 3 is a waveform diagram showing typical operation of the ignition coil driver module of FIG. I in the ignition control system of FIG. 2.

Referring now to both FIG. 2 and FIG. 3, the operation of ignition coil driver module 10 within ignition control system 100 will now be described with a $V_{BATT}$ voltage of 14 volts. In response to an ignition signal received via switch 110, control module 102 connects battery voltage $V_{BATT}$ to VIGN 108. Control module 102 then receives vehicular operational and diagnostic data via I/O 104 and determines therefrom the appropriate spark advance and dwell time for optimal engine operation as is known in the automotive industry. Based upon the determination of spark advance, dwell time and other factors such as $V_{BATT}$ level, for example, control module 102 provides a predetermined duration low drive signal to normally on transistor 114, which causes INPUT 18 of ignition coil driver module 10 to be connected to VIGN 108 through resistor R 116. Ignition control driver module 10 has been designed to draw an operating current of between approximately 2–3 milliamperes at INPUT 18, so that resistor R 116 is chosen to be approximately 500 ohms.

With $V_{BATT}$, and hence VIGN, equal to 14 volts, and taking into account the voltage drop across R116 due to the 2–3 milliampere operating current, the voltage 120 (FIG. 3) at INPUT 18 rises to approximately 12.5 volts in response to the low drive signal impressed upon transistor 114 by control module 102. Upon receiving 12.5 volts at INPUT 18, the current generator 54 and gate drive 56 circuits are energized. Since the voltage at INPUT 18 is less than the over-voltage inhibit voltage of over-voltage inhibit circuit 52, but greater than the clamp voltage of the output circuitry of gate drive circuit 56, the voltage 122 (FIG. 3) at OUT 36 of control integrated circuit 12 rises immediately to the clamp voltage of approximately 7 volts.

A voltage of approximately 7 volts at OUT 36 turns on IGBT 45 to full conduction so that a load current $I_L$ 124 (FIG. 3) begins to increase through the primary coil 118 of the ignition coil 115. A 100:1 ratio of the load current $I_L$ is fed back as a sense current IS to the current limit circuit 58 of control integrated circuit 12 via IGBT leg 42. When the load current $I_L$ increases to approximately 6 amperes (corresponding to a sense current $I_S$ of approximately 60 milliamperes), the current limit circuit 58 begins to pull current out of the output circuitry of the gate drive circuit 56 as previously discussed, thereby decreasing the IGBT drive voltage at OUT 36 of control integrated circuit 12. Equilibrium within current limit circuit 58 is reached when the load current $I_L$ 124 reaches approximately 7 amperes, corresponding to a voltage at OUT 36 of approximately 2.35 volts. Load current $I_L$ 124 is thereafter maintained at a constant 7 ampere level for the duration of the low drive signal impressed upon transistor 114 by control module 102. When transistor 114 is turned back on, the various circuits within control integrated circuit 12 are returned to their deenergized state, thereby turning off the drive voltage 122 to the gate 38 of IGBT 45.

Several advantages of the ignition coil driver module 10 of the present invention over both the prior art hybrid and single integrated circuit ignition coil driving approaches have been described herein. Another important advantage of this dual integrated circuit concept over the single integrated circuit approach in particular lies its inherent ability to adapt to changing requirements. Specifically, the two-chip partitioning described herein permits the load drive integrated circuit 14 to be exchanged for larger or smaller current capability devices without changing the design, layout or tooling of the control integrated circuit 12. This represents both a time and cost savings advantage where multiple applications requiring different load currents are required.

While the invention has been illustrated and described in detail in the foregoing drawings and description, the same is to be considered as illustrative and not restrictive in character, it being understood that only the preferred embodiment has been shown and described and that all changes and modifications that come within the spirit of the invention are desired to be protected. For example, although the ignition coil driver module 10 is shown and described as driving the primary coil 118 of an ignition coil 115, it is to be understood that the present invention contemplates alternate embodiments wherein the dual integrated circuit concept of the present invention may be implemented in a control system required to drive any high current inductive, resistive or capacitive load, or any combination thereof. As a second example, although the ignition coil driver module 10 is shown an described as being implemented as a so-called low side driver, it is to be understood that module 10 can also be made to operate as a high-side driver, i.e. with the IGBT 45 connected directly to VIGN 108, and the load (primary coil 118) being connected between IGBT 45 and ground potential. Those skilled in the art will recognize that only minor modifications to control integrated circuit 12 need be made in order to effectuate such an arrangement such as, for example, the addition thereto of voltage doubling circuitry for driving the gate of the IGBT 45.

The embodiments of the invention in which an exclusive property or privilege is claimed are defined as follows:

1. A high current load driver module comprising:
   a control circuit responsive to a low voltage control signal to provide a low voltage drive signal, said control circuit formed of a low voltage semiconductor material arranged as a first integrated circuit;
   a high current load driver circuit responsive to said low voltage drive signal to energize a high current load, said high current load driver circuit formed of a high voltage semiconductor material arranged as a second integrated circuit separate from said first integrated circuit; and
   a housing having a first terminal extending therein and forming an integrated circuit mount within said housing, said first integrated circuit having a substrate attached to said mount yet electrically insulated therefrom via an electrically insulating circuit mount medium separate from said integrated circuit mount, said second integrated circuit having a substrate attached and electrically connected to said mount via an electrically conductive circuit mount medium separate from said integrated circuit mount.

2. A high current load driver module comprising:
   a low voltage integrated circuit responsive to a low voltage control signal to simultaneously derive all electrical power needed to power said low voltage integrated circuit from said control signal and produce a low voltage drive signal corresponding thereto;
   a high current integrated circuit separate from said low voltage integrated circuit and responsive to said low voltage drive signal to energize a high current load; and
   a housing having said low voltage and high current integrated circuits mounted therein.

3. The high current load driver module of claim 1 wherein said housing includes a second terminal extending therein and electrically connected to said first integrated circuit, said second terminal receiving the low voltage control signal thereat and providing the low voltage control signal to said control circuit.

4. The high current load driver module of claim 3 wherein said first terminal is adapted for connection to the high current load to thereby provide a load current path from the high current load through said high current load drive circuit.

5. The high current load driver module of claim 4 wherein said housing includes a third terminal extending therein and electrically connected to each of said first and second integrated circuits, said third terminal adapted for connection to a high current load drive module ground reference for providing a ground potential reference thereto.

6. The high current load driver module of claim 1 wherein said integrated circuit mount is electrically connected to said substrate of said second integrated circuit via attachment of said second integrated circuit to said mount.

7. The high current load driver module of claim 6 wherein said second integrated circuit substrate is attached to said mount by solder attachment, and wherein said mount further acts as a heat sink to thereby dissipate heat generated by said high current load driver circuit.

8. The high current load driver module of claim 7 wherein said first integrated circuit substrate is attached to said mount via an electrically insulating attachment medium.

9. The high current load driver module of claim 1 wherein said high current load driver circuit includes a power transistor, said power transistor having a first input for receiving said low voltage drive signal, a second input for receiving a load current from the high current load, and an output, said power transistor conducting said load current from said second input to said output in response to said low voltage drive signal.

10. The high current load driver module of claim 9 wherein said power transistor is an insulated gate bipolar transistor.

11. The high current load driver module of claim 1 wherein said high current load is an inductive load.

12. The high current load driver module of claim 11 wherein said inductive load is a primary coil of an ignition coil for an internal combustion engine.

13. The high current load driver module of claim 1 wherein said low voltage drive signal provided by said control circuit has a maximum voltage of approximately 7.0 volts.

14. The high current load driver module of claim 13 wherein said high current load driver circuit is operable to drive the high current load having a load current associated therewith within a range of between approximately 500 milliamperes to approximately 20 amperes.

15. The high current load driver module of claim 2 wherein said low voltage drive signal provided by said low voltage integrated circuit has a maximum voltage of approximately 7.0 volts.

16. The high current load driver module of claim 15 wherein said high current integrated circuit is operable to drive the high current load having a load current associated therewith within a range of between approximately 500 milliamperes and approximately 20 amperes.

17. The high current load driver module of claim 16 wherein said high current integrated circuit includes a power transistor having an input terminal connected to said low voltage drive signal of said low voltage integrated circuit, said low voltage drive signal providing a low level drive current to said input terminal of said power transistor to thereby turn on said power transistor to full conduction.

18. The high current load driver module of claim 17 wherein said low level of input current is within a range of between approximately 200 micro amperes to approximately 3.0 milliamperes.

19. The high current load driver module of claim 18 wherein said power transistor is an insulated gate bipolar transistor.

20. The high current load driver module of claim 2 wherein said high current load is an inductive load.

21. The high current load driver module of claim 20 wherein said inductive load is a primary coil of an ignition coil for an internal combustion engine.

22. The high current load driver module of claim 2 further including a plurality of electrical conductors extending into said housing and forming an electrical connection with said low voltage integrated circuit and said high current integrated circuit.

23. The high current load driver module of claim 2 wherein said low voltage integrated circuit is formed of a low voltage semiconductor material.

24. The high current load driver module of claim 23 wherein said high current integrated circuit is formed of a high voltage semiconductor material.

* * * * *